(12) United States Patent
Jang et al.

(10) Patent No.: US 10,672,481 B2
(45) Date of Patent: Jun. 2, 2020

(54) SEMICONDUCTOR MEMORY DEVICE AND OPERATING METHOD THEREOF

(71) Applicant: SK hynix Inc., Icheon-si, Gyeonggi-do (KR)

(72) Inventors: Sang Hyun Jang, Icheon-si (KR); Kyoung Jin Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 83 days.

(21) Appl. No.: 15/865,858

(22) Filed: Jan. 9, 2018

(65) Prior Publication Data

US 2018/0350440 A1 Dec. 6, 2018

(30) Foreign Application Priority Data

Jun. 2, 2017 (KR) .......................... 10-2017-0069190

(51) Int. Cl.
| | | |
|---|---|---|
| *G11C 16/16* | (2006.01) | |
| *G11C 11/406* | (2006.01) | |
| *G11C 7/10* | (2006.01) | |
| *G11C 16/34* | (2006.01) | |
| *H01L 27/11529* | (2017.01) | |
| *G11C 16/04* | (2006.01) | |

(52) U.S. Cl.
CPC ............ *G11C 16/16* (2013.01); *G11C 7/1045* (2013.01); *G11C 11/40607* (2013.01); *G11C 16/345* (2013.01); *G11C 16/3445* (2013.01); *G11C 16/3459* (2013.01); *H01L 27/11529* (2013.01); *G11C 16/0483* (2013.01)

(58) Field of Classification Search
CPC .................................................... G11C 16/16
See application file for complete search history.

(56) References Cited

U.S. PATENT DOCUMENTS 5,761,702 A * 6/1998 Matsufuji ................ G11C 7/16
365/230.04
2002/0057599 A1* 5/2002 Miyawaki .............. G11C 16/16
365/185.22

(Continued)

FOREIGN PATENT DOCUMENTS

KR 1020120050184 A 5/2012
KR 1020130091075 A 8/2013

*Primary Examiner* — Hoai V Ho
*Assistant Examiner* — Jay W. Radke
(74) *Attorney, Agent, or Firm* — William Park & Associates Ltd.

(57) ABSTRACT

Disclosed is a semiconductor memory device and a method of operating the same. The semiconductor memory device includes a memory cell array including a plurality of memory blocks, a peripheral circuit configured to perform an erase characteristic check operation and an erase operation on the plurality of memory blocks. The semiconductor memory device also includes a control circuit configured to control the peripheral circuit to perform the erase characteristic check operation and the erase operation, determine whether each of the plurality of memory blocks has a normal erase characteristic or an overerase characteristic according to a result of the erase characteristic check operation for each of the plurality of memory blocks, and set an erase voltage of the erase operation based on the determined erase characteristic according to the result of the erase characteristic check operation.

27 Claims, 8 Drawing Sheets

(56) References Cited

U.S. PATENT DOCUMENTS

| | | | | |
|---|---|---|---|---|
| 2002/0093347 A1* | 7/2002 | Henderson | ............ | G11C 15/04 |
| | | | | 324/678 |
| 2008/0165557 A1* | 7/2008 | Godard | ................ | G11C 15/046 |
| | | | | 365/49.17 |
| 2009/0316460 A1* | 12/2009 | Orginos | ............. | G11C 29/4401 |
| | | | | 365/49.1 |
| 2017/0133104 A1* | 5/2017 | Darbari | ............... | G06F 11/2221 |

* cited by examiner

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2017-0069190 filed on Jun. 2, 2017 in the Korean Intellectual Property Office, the entire disclosure of which is incorporated herein by reference.

BACKGROUND

1. Technical Field

The present disclosure relates to an electronic device, and more particularly, to a semiconductor memory device and an operating method thereof.

2. Related Art

A semiconductor memory device among semiconductor devices is generally classified into either a volatile memory device or a nonvolatile memory device.

The nonvolatile memory device has a relatively low write and read rate, but maintains stored data even though a power supply is blocked. Accordingly, the nonvolatile memory device is used to store data, which needs to be maintained regardless of the power supply. The nonvolatile memory device includes a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is divided into a NOR type and a NAND type.

Flash memory has an advantage over RAM, in which data is freely programmed and erased, and an advantage over ROM, in which stored data can be maintained even though a power supply is blocked. Flash memory is widely used as a storage medium of a portable electronic device, such as a digital camera, a Personal Digital Assistant (PDA), and an MP3 player.

SUMMARY

The present disclosure has been made in an effort to solve the above-described problems associated with the prior art, and provides a semiconductor memory device which is capable of improving reliability during an erase operation of the semiconductor memory device, and an operating method thereof.

An embodiment of the present disclosure provides a semiconductor memory device, including: a memory cell array including a plurality of memory blocks; a peripheral circuit configured to perform an erase characteristic check operation and an erase operation on the plurality of memory blocks; and a control circuit configured to control the peripheral circuit to perform the erase characteristic check operation and the erase operation, determine whether each of the plurality of memory blocks has a normal erase characteristic or an overerase characteristic according to a result of the erase characteristic check operation for each of the plurality of memory blocks, and set an erase voltage of the erase operation based on the determined erase characteristic according to the result of the erase characteristic check operation.

Another embodiment of the present disclosure provides a semiconductor memory device, including: a memory cell array including a plurality of memory blocks; a peripheral circuit configured to sequentially perform an erase voltage application operation, a first erase verification operation, and a second erase verification operation on the plurality of memory blocks; and a control circuit configured to control the peripheral circuit to perform the erase voltage application operation, the first erase verification operation, and the second erase verification operation, configured to generate data corresponding to an erase characteristic of each of the plurality of memory blocks according to results of the first erase verification operation and the second erase verification operation, and configured to set an erase voltage of an erase operation for a selected memory block of the plurality of memory blocks based on the data corresponding to the erase characteristic of the selected memory block.

Yet another embodiment of the present disclosure provides a method of operating a semiconductor memory device, including: applying an initial erase voltage to a selected memory block among a plurality of memory blocks; performing a first erase verification operation using a first erase verification level; performing a second erase verification operation using a second erase verification level that is lower than the first erase verification level when it is determined that a result of the first erase verification operation is pass; determining that the selected memory block has an overerase characteristic and generating data corresponding to a result of the determination when it is determined that a result of the second erase verification operation is pass; determining that the selected memory block has a normal erase characteristic and generating the data corresponding to a result of the determination when it is determined that the result of the second erase verification operation is fail; and setting an erase voltage for an erase operation of the selected memory block based on whether the selected memory block has the normal erase characteristic or the overerase characteristic.

According to embodiments of the present disclosure, an erase voltage for each block is set according to an erase characteristic of the respective block of a semiconductor memory device, thereby improving reliability of an erase operation.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

Advantages and features of the present disclosure and methods of achieving the advantages and features will be described with reference to embodiments described in detail below together with the accompanying drawings. However, the present disclosure is not limited to the embodiments described herein, and may be implemented in various different forms. However, the embodiments described herein are provided to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
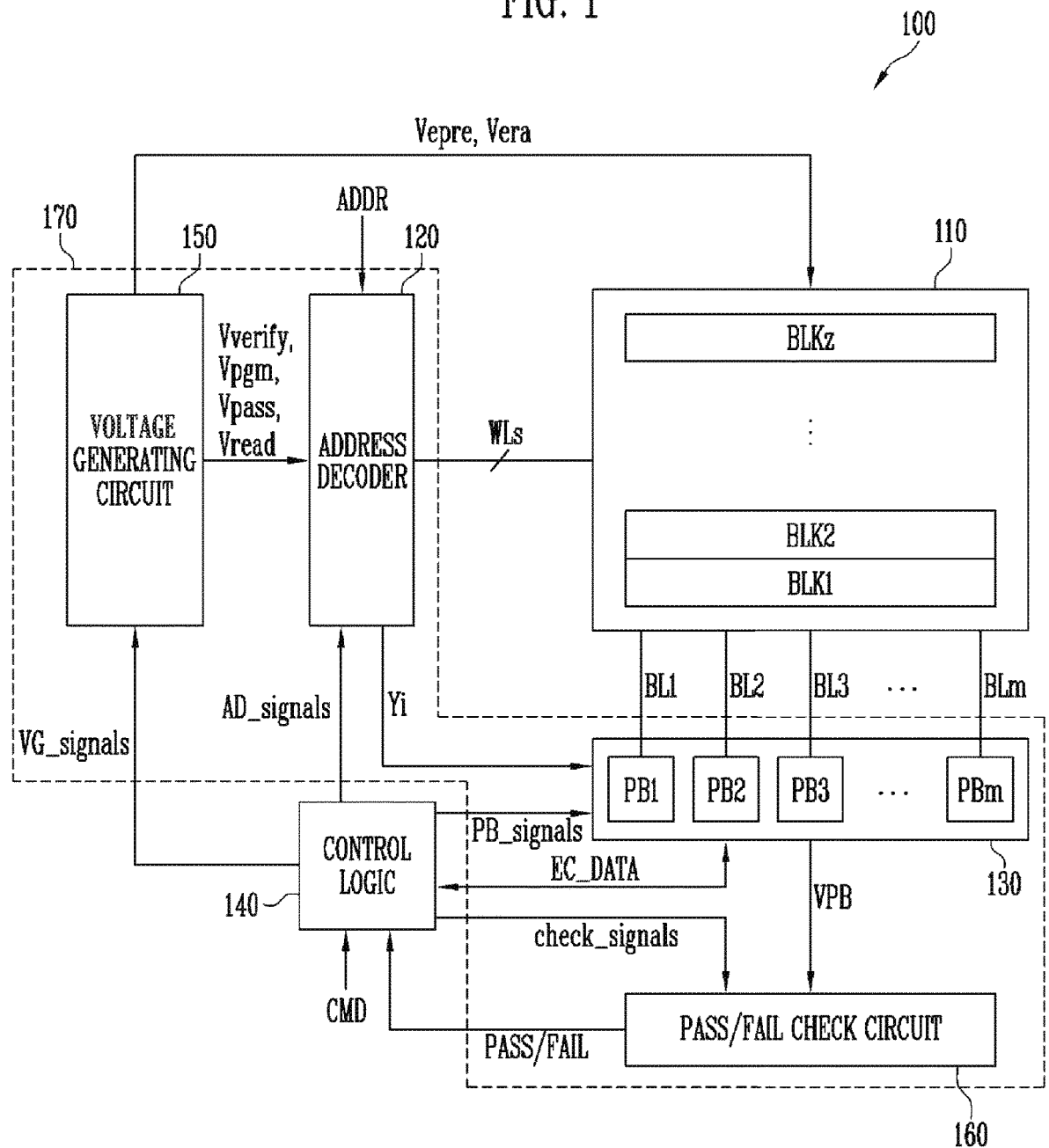
FIG. 1 is a block diagram for describing a semiconductor memory device according to an embodiment of the present disclosure.

FIG. 1 is a block diagram illustrating a semiconductor memory device according to the present disclosure.

Referring to FIG. 1, a semiconductor memory device 100 includes a memory cell array 110, an address decoder 120, a read and write circuit 130, a control circuit (also referred to as "control logic") 140, a voltage generating circuit or voltage generator 150, and a pass/fail check circuit 160.

The address decoder 120, the read and write circuit 130, the voltage generator 150, and the pass/fail check circuit 160 may be defined as a peripheral circuit 170 for performing an erase characteristic check operation and an erase operation on the memory cell array 110. For example, the control logic 140 may control the peripheral circuit 170 to perform the erase characteristic check operation and the erase operation on the memory cell array 110.

The memory cell array 110 includes a plurality of memory blocks BLK1 to BLKz. The plurality of memory blocks BLK1 to BLKz may be connected to the address decoder 120 through word lines WLs. The plurality of memory blocks BLK1 to BLKz may be connected to the read and write circuit 130 through bit lines BL1 to BLm. Each of the plurality of memory blocks BLK1 to BLKz includes a plurality of memory cells for storing normal data and a plurality of erase characteristic (EC) cells for storing EC data EC DATA. EC data is data that corresponds to an erase characteristic, for example, an erase characteristic of one or more memory blocks. In some embodiments, EC data corresponds to a determination result of an erase characteristic check operation. EC cells are memory cells that store EC data. In one example, the plurality of memory cells and the plurality of EC cells may be non-volatile memory cells, and more particularly, the plurality of memory cells may be non-volatile memory cells based on a charge trap device. The plurality of memory cells which are commonly connected to the same word line may be defined as one page. The memory cell array 110 may be formed of a plurality of pages.

In the example embodiment of the present disclosure, it is described that the plurality of memory blocks includes a plurality of EC cells, but the plurality of memory blocks may include a plurality of flag cells.

The address decoder 120 is connected to the memory cell array 110 through the word lines WLs. The address decoder 120 is configured to be operated in response to control signals AD_signals output from the control logic 140. The address decoder 120 receives an address ADDR through an input/output buffer (not illustrated) inside the semiconductor memory device 100.

The address decoder 120 may control the word lines WLs of a selected memory block to be in a floating state during an application operation of an erase voltage in the erase characteristic check operation, and may apply an erase verification voltage Vverify to the word lines WLs of the selected memory block during a first or second erase verification operation of the erase characteristic check operation.

The address decoder 120 may control the word lines WLs of the selected memory block to be in a floating state during an application operation of an erase voltage in the erase operation, and may apply an erase verification voltage Vverify to the word lines WLs of the selected memory block during an erase verification operation in the erase operation.

Further, the address decoder 120 may apply a program voltage Vpgm and a pass voltage Vpass to the word lines WLs of the selected memory block during a EC data program operation, and apply a read voltage Vread and a pass voltage Vpass to the word lines WLs of the selected memory block during a EC data read operation.

An address ADDR received when the erase characteristic check operation or the erase operation of the semiconductor memory device 100 is requested is included in a block address, and the address decoder 120 may select one or more memory blocks according to the block address.

Further, the address ADDR received during various operations including the erase operation of the semiconductor memory device 100 includes a block address, a row address, and a column address. The address decoder 120 selects one memory block and one word line according to the block address and the row address. A column address Yi is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The plurality of page buffers PB1 to PBm is connected to the memory cell array 110 through the bit lines BL1 to BLm. Each of the plurality of page buffers PB1 to PBm senses a potential level or the quantity of a current of a bit line of the selected memory block and outputs a sensing voltage VPB during the erase verification operation in the erase characteristic check operation and the erase verification operation in the erase operation.

Further, the read and write circuit 130 temporarily stores the EC data EC_DATA received from the control logic 140 during a EC data program operation, and then controls potential levels of bit lines corresponding to the plurality of EC cells according to the temporarily stored EC data EC_DATA. Further, the read and write circuit 130 senses the potential level or the quantity of current of the bit lines corresponding to the plurality of EC cells during the EC data read operation and reads the EC data EC_DATA, and outputs the read EC data EC_DATA to the control logic 140.

The read and write circuit 130 operates in response to control signals PB_signals output from the control logic 140.

The control logic 140 is connected to the address decoder 120, the read and write circuit 130, the voltage generating circuit 150, and the pass/fail check circuit 160. The control logic 140 receives a command CMD through the input/output buffer (not illustrated) of the semiconductor memory device 100. The control logic 140 is configured to control various operations including the erase characteristic check operation and the erase operation of the semiconductor memory device 100 in response to the command CMD. The control logic 140 generates and outputs control signals AD_signals for controlling the address decoder 120, control signals PB_signals for controlling the read and write circuit 130, control signals VG_signals for controlling the voltage generating circuit 150, and control signals Check_signals for controlling the pass/fail check circuit 160 in response to the command CMD.

When a command CMD corresponding to the erase characteristic check operation is input, the control logic 140 determines an erase characteristic for each of the plurality of memory blocks BLK1 to BLKz by sequentially performing an erase voltage application operation and the first and second erase verification operations on each of the plurality of memory blocks BLK1 to BLKz, and controls the peripheral circuit 170 to store the determination result in EC cells included in a respective block of the plurality of memory blocks BLK1 to BLKz as the EC data EC_DATA.

The control logic 140 controls the peripheral circuit 170 to perform the erase voltage application operation, the first erase verification operation using a first erase verification level that is the same as a normal verification level, and the second erase verification operation using a second erase verification level that is lower than the normal verification level during the erase characteristic check operation, and checks (determines) an erase characteristic of each of the plurality of memory blocks BLK1 to BLKz according to the result of the first erase verification operation and the second erase verification operation, divides the plurality of memory blocks BLK1 to BLKz into memory blocks having a normal erase characteristic and memory blocks having an overerase characteristic, and generates EC data EC_DATA. Further, when a pass signal PASS is generated in both the first erase verification operation and second erase verification operation, the control logic 140 may determine that the selected memory block has the overerase characteristic. Further still, when the pass signal PASS is generated in the first erase verification operation and the fail signal is generated in the second erase verification operation, the control logic 140 may determine that the selected memory block has the normal erase characteristic.

When a command CMD corresponding to the erase operation is input, the control logic 140 sets an erase voltage Vera by using the EC data EC_DATA stored in the selected memory block. The control logic 140 controls the peripheral circuit 170 to perform an erase operation of the selected memory block by using the set erase voltage.

The voltage generating circuit 150 is operated in response to control signals VG_signals output from the control logic 140.

The voltage generating circuit 150 generates and outputs an erase verification voltage Vverify for the first erase verification operation and the second erase verification operation under the control of the control logic 140 during the erase characteristic check operation, generates and outputs a program voltage Vpgm and a pass voltage Vpass during the EC data program operation, and generates and outputs a read voltage Vread and a pass voltage Vpass during the EC data read operation.

The voltage generating circuit 150 sequentially generates a pre-erase voltage Vepre and an erase voltage Vera under control of the control logic 140 during the erase operation and provides the generated pre-erase voltage Vepre and erase voltage Vera to the selected memory blocks among the plurality of memory blocks BLK1 to BLKz through a common source line of the memory cell array 110. The voltage generating circuit 150 may adjust a potential level of the erase voltage Vera under control of the control logic 140.

The pass/fail check circuit 160 is operated in response to control signals Check_signals output from the control logic 140.

The pass/fail check circuit 160 compares the sensing voltage VPB output from the read and write circuit 130 with a reference voltage during the first and second erase verification operations of the erase characteristic check operation and the erase verification operation of the erase operation, determines a pass or a fail result of the erase operation of the selected memory block, and outputs the pass signal PASS or a fail signal FAIL. For example, when it is determined that the potential level of the sensing voltage VPB output from the read and write circuit 130 is higher than the level of the reference voltage, the pass/fail check circuit 160 outputs the pass signal PASS, and when it is determined that the potential level of the sensing voltage VPB is lower than the level of the reference voltage, the pass/fail check circuit 160 outputs the fail signal FAIL. The sensing voltage VPB output from the read and write circuit 130 may vary according to the number of program failed memory cells and the number of program passed memory cells among the plurality of memory cells connected to the plurality of bit lines BL1 to BLm connected to the read and write circuit 130. For example, when the number of failed memory cells increases, the potential level of the sensing voltage VPB is decreased, and when the number of program passed memory cells increases, the potential level of the sensing voltage VPB is increased. The reference voltage may be set according to the number of allowable failed bits. For example, an error of the data received from the semiconductor memory device 100 is detected and corrected by using an Error Correcting Code (ECC), and the reference voltage may be set according to the maximum number of failed bits which are correctable by the ECC. That is, the pass/fail check circuit 160 compares the sensing voltage VPB output from the read and write circuit 130 with the reference voltage, and when the number of memory cells determined to be a program fail is equal to or smaller than the maximum number of failed bits correctable by the ECC, the pass/fail check circuit 160 outputs the pass signal PASS, and when the number of memory cells determined to be in the program failed state is larger than the maximum number of failed bits which are correctable by the ECC, the pass/fail check circuit 160 outputs the fail signal FAIL.

Figure 2:
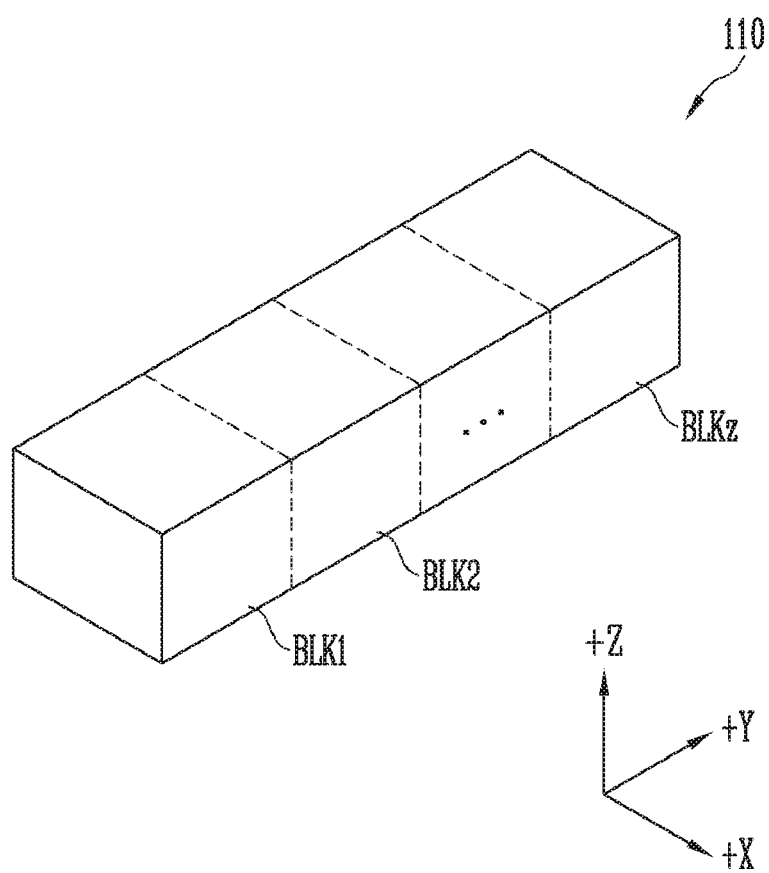
FIG. 2 is a block diagram illustrating an embodiment of a memory cell array of FIG. 1.

FIG. 2 is a block diagram illustrating an embodiment of a memory cell array 110 of FIG. 1.

Referring to FIG. 2, the memory cell array 110 includes a plurality of memory blocks BLK1 to BLKz. Each of the memory blocks has a three-dimensional structure. Each of the memory blocks includes a plurality of memory cells stacked on a substrate. The plurality of memory cells is arranged in a +X-axis direction, a +Y-axis direction, and a +Z-axis direction. A structure of each of the memory blocks will be described in more detail with reference to FIG. 3.

Figure 3:
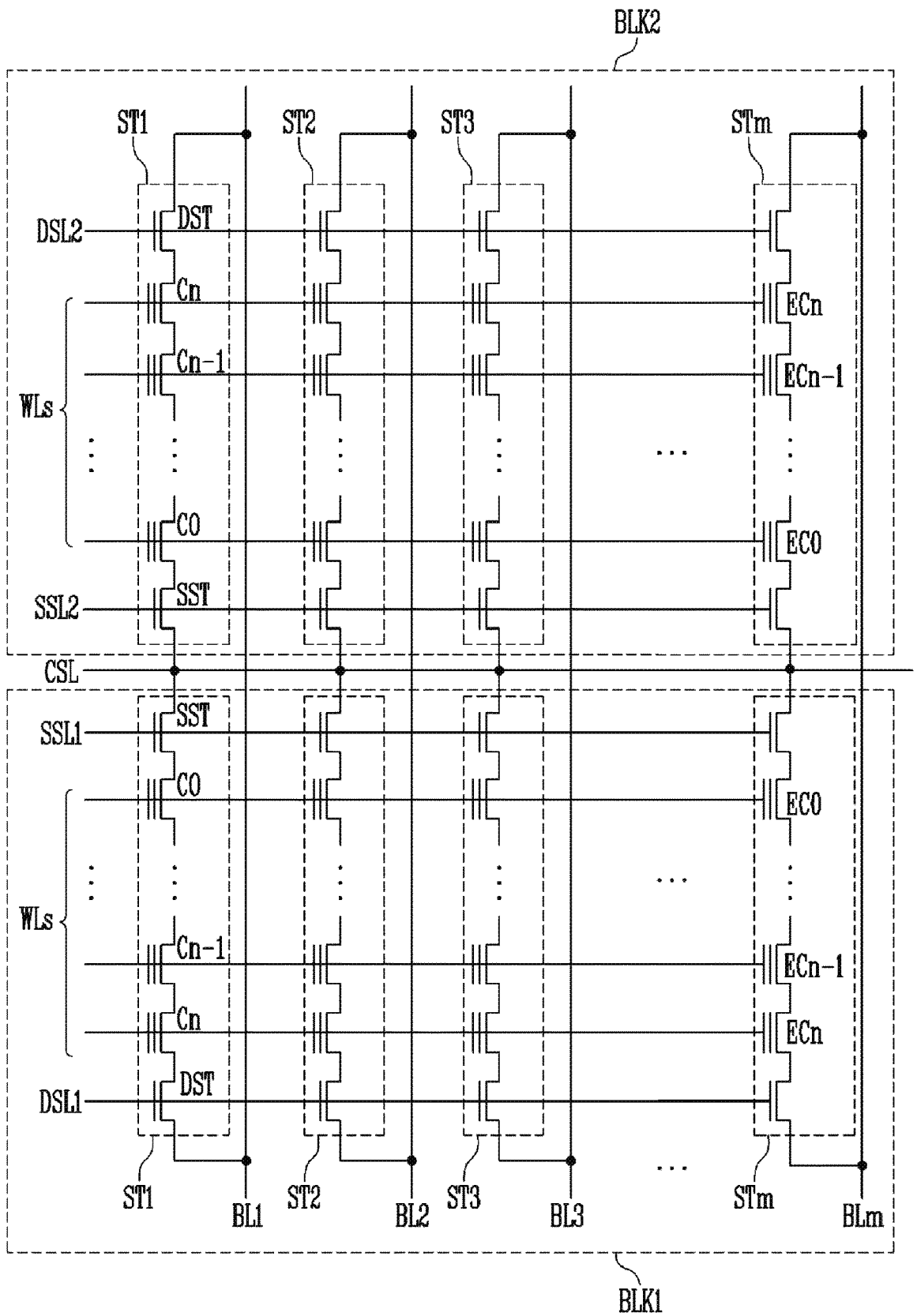
FIG. 3 is a circuit diagram for describing a memory block of FIG. 1.

FIG. 3 is a circuit diagram for describing the memory block of FIG. 1.

The plurality of memory blocks BLK1 to BLKz illustrated in FIG. 1 is connected with the read and write circuit 130 through the bit lines BL1 to BLm, but the illustration and the description of the drawing, the memory block BLK1 and the memory block BLK2 are representatively illustrated. The memory block BLK1 and the memory block BLK2 have structures sharing the same bit lines BL1 to BLm and a common source line CSL.

Referring to FIG. 3, the memory block BLK1 and the memory block BLK2 are connected to the plurality of bit lines BL1 to BLm.

The memory block BLK1 includes the plurality of cell strings ST1 to STm. The plurality of cell strings ST1 to STm is connected between the plurality of bit lines BL1 to BLm and the common source line CSL, respectively. Each of the plurality of cell strings ST1 to STm includes a source select transistor SST, the plurality of serially connected memory cells C1 to Cn, and a drain select transistor DST. The source select transistor SST is connected to a source select line SSL1. The plurality of memory cells C0 to Cn is connected to the word lines WLs, respectively. The drain select transistor DST is connected to a drain select line DSL1. The common source line CSL is connected to a source side of the source select transistor SST. Each of the bit lines BL1 to BLm is connected to a drain side of the corresponding drain select transistor DST.

The memory block BLK2 may be formed in a similar structure to that of the memory block BLK1. That is, the memory block BLK2 includes the plurality of strings ST1 to STm, and the plurality of strings ST1 to STm is connected between the plurality of bit lines BL1 to BLm and the common source line CSL, respectively. Each of the plurality of cell strings ST1 to STm includes a source select transistor SST, a plurality of serially connected memory cells C0 to Cn, and a drain select transistor DST. The source select transistor SST is connected to a source select line SSL2. The plurality of memory cells C0 to Cn is connected to the word lines WLs, respectively. The drain select transistor DST is connected to a drain select line DSL2. The common source line CSL is connected to a source side of the source select transistor SST. Each of the bit lines BL1 to BLm is connected to a drain side of the corresponding drain select transistor DST.

Each memory block BLK1 and BLK2 includes EC cells EC0 to ECn. In an embodiment of the present disclosure, it is described that the cell string STm included in each memory block BLK1 and BLK2 includes the CAM cells EC0 to ECn. EC data corresponding to an erase characteristic of a corresponding memory block may be stored in the EC cells EC0 to ECn.

As described above, the memory block BLK1 and the memory block BLK2 are formed in similar structures, and the drain select lines DSL1 and DSL2 and the source select lines SSL1 and SSL2 connected to the memory block BLK1 and the memory block BLK2, respectively, may be designed to have electrically isolated structures.

Figure 4:
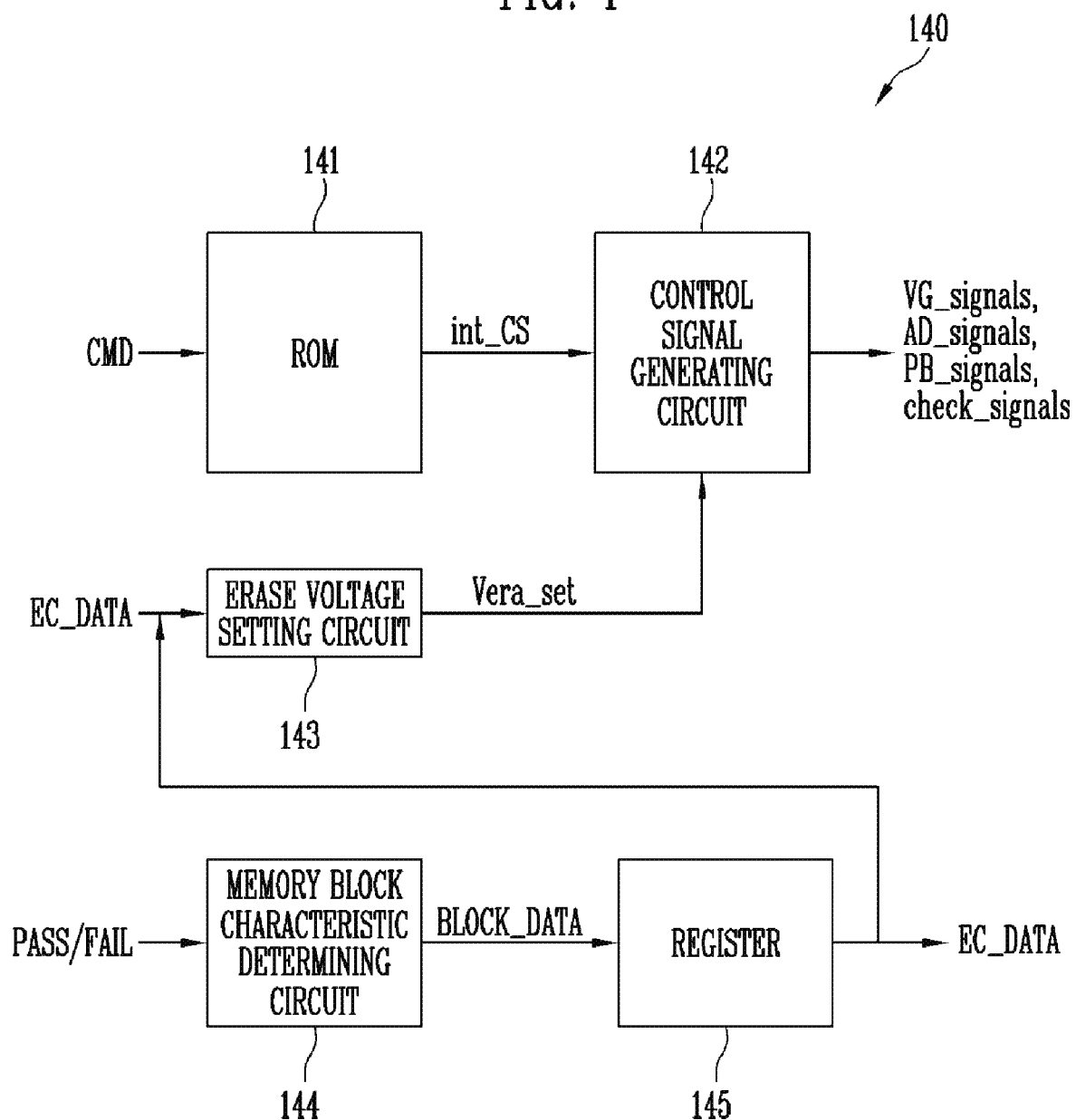
FIG. 4 is a block diagram illustrating an embodiment of a control logic of FIG. 1.

FIG. 4 is a block diagram illustrating an embodiment of the control logic of FIG. 1.

Referring to FIG. 4, the control logic 140 may include a ROM 141, a control signal generating circuit 142, an erase voltage setting circuit 143, a memory block characteristic determining circuit 144, and a register 145.

An algorithm for performing various operations and the erase characteristic check operation of the semiconductor memory device may be stored in the ROM 141. The ROM 141 outputs an internal control signal int_CS according to the algorithm in response to a command CMD input from the outside, for example, a host Host connected with the semiconductor memory device. The command CMD may correspond to the erase characteristic check operation or the erase operation.

The control signal generating circuit 142 outputs the plurality of control signals VG_signals, AD_signals, PB_signals, and check_signals for controlling the peripheral circuit 170 (the voltage generating circuit 150, the address decoder 120, the read and write circuit 130, and the pass/fail check circuit 160 of FIG. 1) in response to the internal control signal int_CS output from the ROM 141. Further, the control signal generating circuit 142 may generate and output the control signals VG_signals for controlling the voltage generating circuit 150 to generate the set erase voltage in response to an erase voltage setting signal Vera_set output from the erase voltage setting circuit 143. Further still, the control signal generating circuit 142 may output the control signal VG_signals for controlling the peripheral circuit 170 to adjust a potential level of the erase voltage used in the erase operation where the potential level of the erase voltage is adjusted in response to the erase voltage setting signal Vera_set.

The erase voltage setting circuit 143 outputs the erase voltage setting signal Vera_set corresponding to the level of the erase voltage in response to the EC data EC DATA read by the EC_data read operation, where the EC data EC_DATA may correspond to an erase characteristic. As an example, the erase voltage setting circuit 143 may store an erase voltage table corresponding to the plurality of erase voltage levels, and may select one of the plurality of erase voltage levels in response to the EC data EC_DATA and output the erase voltage setting signal Vera_set corresponding to the selected erase voltage level.

The memory block characteristic determining circuit 144 determines whether each of the plurality of memory blocks has the normal erase characteristic or the overerase characteristic in response to the pass signal PASS or the fail signal FAIL output from the pass/fail check circuit 160 (see FIG. 1), and outputs block data BLOCK_DATA.

The register 145 stores block data BLOCK_DATA generated in the memory block characteristic determining circuit 144, and outputs the block data BLOCK_DATA corresponding to the selected memory block as EC data EC_DATA corresponding to the erase characteristic during the EC data program operation.

In an embodiment of the present disclosure, the scheme, in which an erase characteristic of each memory block is determined and then the result of the determination is stored in the EC cells of each memory block as EC data, has been described, but the EC Data may be stored in the register 145 of the control logic 140 and an erase voltage may be set by using the EC data stored in the register 145 during the erase operation.

Figure 5:
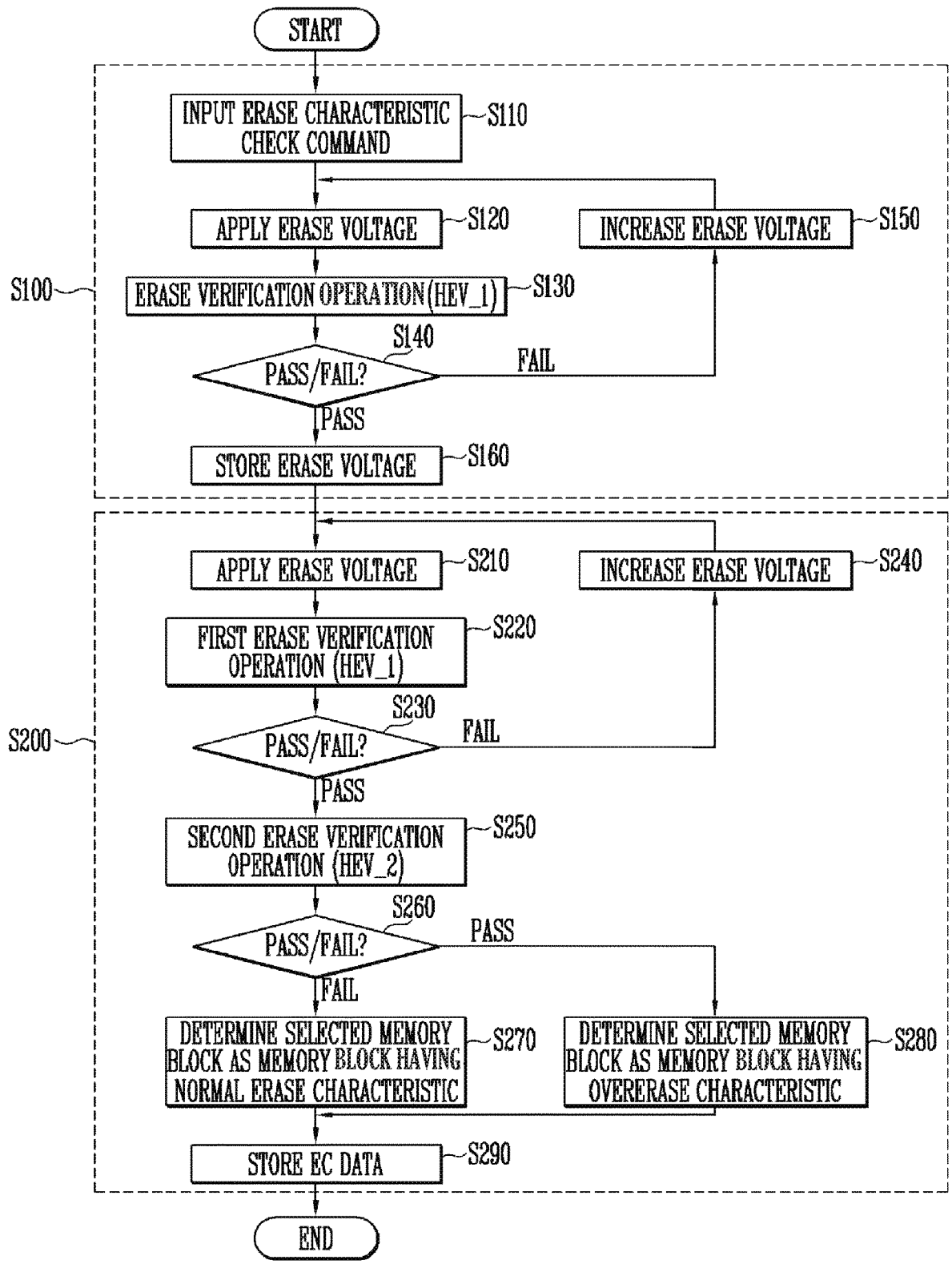
FIG. 5 is a flowchart for describing a method of checking an erase characteristic of the semiconductor memory device according to an embodiment of the present disclosure.

FIG. 5 is a flowchart for describing an operation of the semiconductor memory device according to an embodiment of the present disclosure.

Figure 6:
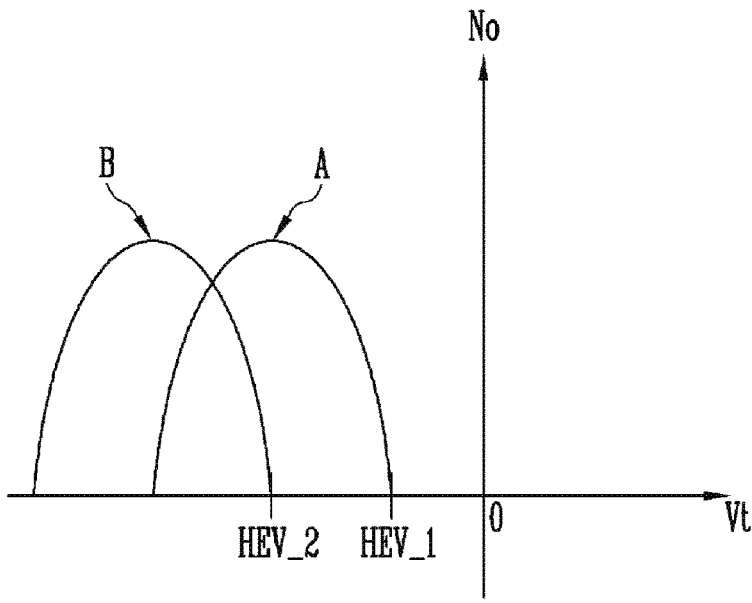
FIG. 6 is a threshold voltage distribution diagram for describing a first erase verification level and a second erase verification level of the present disclosure.

FIG. 6 is a threshold voltage distribution diagram for describing the first erase verification level of the first erase verification operation and the second erase verification level of the second erase verification operation in the operation of the semiconductor memory device according to an embodiment of the present disclosure.

The erase characteristic check operation of the semiconductor memory device according to an embodiment of the present disclosure will be described below with reference to FIGS. 1 to 6.

The erase operation characteristic check operation may be performed by sequentially executing an initial erase voltage setting operation S100 and a block characteristic determining operation S200. Further, after the initial erase voltage setting operation S100 is performed, test data may be programmed in a selected memory block and the block characteristic determining operation S200 may be performed. The test data may be random data.

The initial erase voltage setting operation S100 will be described below.

When a command for the erase characteristic check operation is input from the outside (S110), the control logic 140 controls the peripheral circuit 170 to sequentially perform an erase voltage application operation S120 on a selected memory block among the plurality of memory blocks in the erase characteristic check operation.

The erase voltage application operation S120 will be described in detail below.

The voltage generating circuit 150 generates a pre-erase voltage Vpre and an erase voltage Vera in response to control signals VG_signals and applies the generated pre-erase voltage Vpre and erase voltage Vera to the common source line CSL of the memory cell array 110.

The address decoder 120 controls the word lines WLs of the selected memory block BLK1 to be in a floating state, and applies a selection line voltage (for example, a ground voltage) to each of the drain select line DSL1 and the source select line SSL1. Accordingly, a gate-induced drain leakage (GIDL) current is generated in a lower channel of the source select transistor SST of the selected memory block BLK1 by the pre-erase voltage Vpre applied through the common source line CSL, and hot holes generated by the GIDL current are supplied to a channel layer of the plurality of cell strings ST1 to STm. Then, a potential level of the channel layer is increased by the erase voltage Vera applied through the common source line CSL. When the address decoder 120 discharges the potential levels of the word lines WLs to a ground voltage level, a voltage difference between the word lines WLs and the channel of the cell strings ST1 to STm is sufficiently increased and electrons trapped in a charge storing layer of the memory cells C0 to Cn included in the selected memory block BLK1 are discharged to the channel, so that a threshold voltage is decreased and the data is erased.

In an embodiment of the present disclosure, the present disclosure is described based on the erase operation using the GIDL scheme as an example, but the present disclosure is not limited thereto, the present disclosure is applicable to all of the erase operations for erasing memory cells of the semiconductor memory device. For example, the present disclosure is also applicable to an erase operation of erasing data stored in the memory cells by an FN tunneling scheme by applying an erase voltage having a high potential level to the source line.

Then, an erase verification operation S130 is performed. During the erase verification operation, the voltage generating circuit 150 generates an erase verification voltage Vverify, and the address decoder 120 applies the erase verification voltage Vverify to the word lines WLs of the selected memory block BLK1. The read and write circuit 130 senses the potential level or the quantity of current of the bit lines BL1 to BLm and generates a sensing voltage VPB.

The pass/fail check circuit 160 compares the sensing voltage VPB with a reference voltage, determines whether the erase operation passes or fails, and generates and outputs a pass signal PASS or a fail signal FAIL (S140). When all of the memory cells or a predetermined number or more memory cells of the selected memory block BLK1 are erased to have threshold voltages lower than a first erase verification level HEV_1, the pass/fail check circuit 160 determines that the erase operation passes and outputs a pass signal PASS, and when one or more memory cells or a predetermined number or more memory cells of the selected memory block BLK1 have threshold voltages higher than the first erase verification level HEV_1, the pass/fail check circuit 160 determines that the erase operation fails and outputs a fail signal FAIL. The first erase verification level HEV_1 may be the same level as a normal erase verification level used during the erase operation.

When the fail signal FAIL is output from the pass/fail check circuit 160, the control logic 140 sets the erase voltage Vera by increasing the erase voltage Vera by a step voltage (S150), and controls the peripheral circuit 170 to re-perform the operations from operation S120 by using the set erase voltage Vera.

When the result of a first erase verification operation is a pass, a pass signal PASS is output from the pass/fail check circuit 160 and the control logic 140 sets the finally applied erase voltage Vera as an initial erase voltage and stores the set initial erase voltage (S160). In this case, information about the initial erase voltage may be stored in the register 145.

After the initial erase voltage setting operation S100 is performed, test data may be programmed for the selected memory block. The test data may be random data.

Then, the block characteristic determining operation S200 is performed. The block characteristic determining operation S200 will be described below.

The control logic 140 sets the erase voltage Vera based on the information about the initial erase voltage stored in operation S160 by performing the first erase verification operation, and then controls the peripheral circuit 170 to perform the erase voltage application operation S210 on the selected memory block by using the initial erase voltage during the rest of the erase characteristic check operation after having set the initial erase voltage.

The erase voltage application operation S210 is similar to the erase voltage application operation S120 of the initial erase voltage setting operation S100, so that a detailed description thereof will be omitted.

Then, the control logic 140 may sequentially perform a first erase verification operation S220. The first erase verification operation determines whether threshold voltages of the memory cells are lower or higher than a first erase verification level HEV_1. During the first erase verification operation, the voltage generating circuit 150 generates an erase verification voltage Vverify, and the address decoder 120 applies the erase verification voltage Vverify to the word lines WLs of the selected memory block BLK1. The read and write circuit 130 senses the potential level or the quantity of current of the bit lines BL1 to BLm and generates a sensing voltage VPB.

The pass/fail check circuit 160 compares the sensing voltage VPB with a reference voltage, determines whether the erase operation passes or fails, and the control logic 140 controls the peripheral circuit 170 to generate and output a pass signal PASS or a fail signal FAIL (S230). When all of the memory cells or a predetermined number or more memory cells of the selected memory block BLK1 are erased to have a threshold voltage lower than a first erase verification level HEV_1 during the first erase verification operation, the pass/fail check circuit 160 determines that the erase operation passes and outputs a pass signal PASS, and when one or more memory cells or a predetermined number or more memory cells of the selected memory block BLK1 have a threshold voltage higher than the first erase verification level HEV_1, the pass/fail check circuit 160 determines that the erase operation fails and outputs a fail signal FAIL. The first erase verification level HEV_1 may be the same level as a normal erase verification level used during the erase operation.

When the fail signal FAIL is output from the pass/fail check circuit 160, the control logic 140 sets the erase voltage Vera by increasing the erase voltage Vera by a step voltage (S240), and controls the peripheral circuit 170 to re-perform operations S210 to S230 by using the reset erase voltage Vera.

When the result of the first erase verification operation is a pass the pass signal PASS is output from the pass/fail check circuit 160, the control logic 140 controls the peripheral circuit 170 to sequentially perform a second erase verification operation S250. The second erase verification operation determines whether threshold voltages of the memory cells are lower or higher than a second erase verification level HEV_2. The second erase verification level HEV_2 may be lower than the first erase verification level HEV_1. During the second erase verification operation, the voltage generating circuit 150 generates an erase verification voltage Vverify, and the address decoder 120 applies the erase verification voltage Vverify to the word lines WLs of the selected memory block BLK1. The read and write circuit 130 senses a potential level or the quantity of current of the bit lines BL1 to BLm and generates a sensing voltage VPB.

The pass/fail check circuit 160 compares the sensing voltage VPB with the reference voltage, determines whether the erase operation passes or fails, and the control logic 140 controls the peripheral circuit 170 to generate and output a pass signal PASS or a fail signal FAIL according to the result of the determination (S260). When all of the memory cells or a predetermined number or more memory cells of the selected memory block BLK1 are erased to have a threshold voltage lower than the second erase verification level HEV_2 during the second erase verification operation, the pass/fail check circuit 160 determines that the erase operation passes and outputs a pass signal PASS, and when one or more memory cells or a predetermined number or more memory cells of the selected memory block BLK1 have a threshold voltage higher than the second erase verification level HEV_2, the pass/fail check circuit 160 determines that the erase operation fails and outputs a fail signal FAIL.

When the erase operation is determined as a fail as a result of operation S260, the pass/fail check circuit 160 determines that a threshold voltage of one or more memory cells or a predetermined number or more memory cells of the selected memory block BLK1 is distributed between the first erase verification level HEV_1 and the second erase verification level HEV_2, and determines that the selected memory block BLK1 is the memory block having a normal erase characteristic A (S270).

On the other hand, when the erase operation is determined as a pass as a result of operation S260, the pass/fail check circuit 160 determines that threshold voltages of all of the memory cells or a predetermined number or more of the memory cells of the selected memory block BLK1 are distributed at a level lower than the second erase verification level HEV_2, and determines that the selected memory block BLK1 is the memory block having an overerase characteristic B (S280).

Then, a block characteristic determining circuit of the control logic 140 generates block data BLOCK_DATA obtained by determining whether the selected memory block has the normal erase characteristic or the overerase characteristic according to the pass or fail signal during the first erase verification operation or the second erase verification operation, and stores the generated block data BLOCK_DATA corresponding to an erase characteristic according to a result of the determination in the register 145. Further, the control logic 140 may determine whether the selected memory block has the normal erase characteristic or the overerase characteristic according to the read data, for example, the EC data EC_DATA. Then, the control logic 140 controls the peripheral circuit 170 to program a EC data program operation and stores EC data EC_DATA in EC cells EC0 to ECn of the selected memory block.

The block characteristic determining operation S200 may be sequentially performed on each of the plurality of memory blocks BLK1 to BLKz.

The erase characteristic check operation of the semiconductor memory device according to FIG. 5 may be performed before the erase operation. Further, the erase characteristic check operation may update the EC data according to the erase characteristic of each memory block by re-performing the erase characteristic check operation after a predetermined number of times of the erase operation.

As described above, in an embodiment of the present disclosure, the initial erase voltage setting operation S100 and the block characteristic determining operation S200 are sequentially performed. However, in another embodiment, the initial erase voltage setting operation S100 may be skipped and only the block characteristic determining operation S200 may be performed. In this case, the erase voltage application operation S210 of the block characteristic determining operation S200 may use the erase voltage used in the erase voltage application operation S120 of the initial erase voltage setting operation S100.

Figure 7:
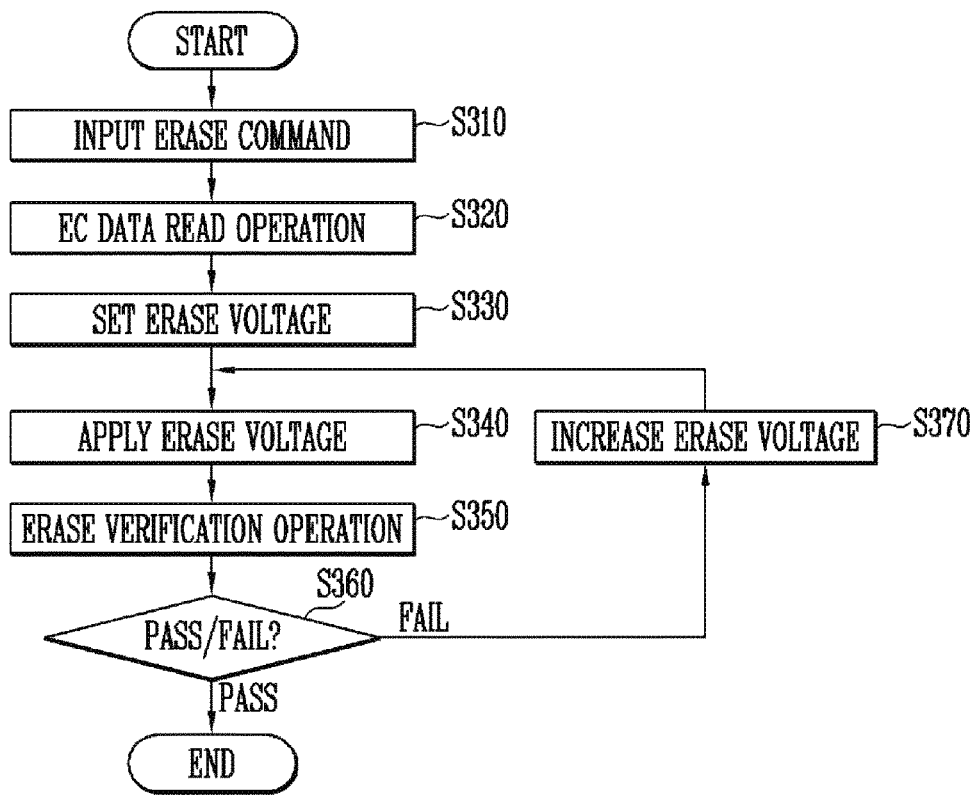
FIG. 7 is a flowchart for describing an erase operation method of the semiconductor memory device according to an embodiment of the present disclosure.

FIG. 7 is a flowchart for describing the erase operation method of the semiconductor memory device according to an embodiment of the present disclosure.

The erase operation of the semiconductor memory device according to an embodiment of the present disclosure will be described below with reference to FIGS. 1 to 4, and 7.

After programming data, when a command CMD for an erase command of a selected memory block is input from the outside (S310), the control logic 140 controls the peripheral circuit 170 to perform a EC Data read operation and reads EC data EC_DATA stored in EC cells EC0 to ECn of the selected memory block (for example, the memory block BLK1) (S320).

The control logic 140 sets an erase voltage Vera in response to the read EC data EC_DATA (S330). The erase voltage setting circuit 143 generates an erase voltage setting signal Vera_set in response to the read EC data EC_DATA. For example, when it is determined that the selected memory block BLK1 is a memory block having a normal erase characteristic according to the read EC data EC_DATA, the erase voltage setting circuit 143 outputs an erase voltage setting signal Vera_set for setting the initial erase voltage set in the initial erase voltage setting operation S100 of FIG. 1 as an erase voltage, and when it is determined that the selected memory block BLK1 is the memory block having an overerase characteristic, the erase voltage setting circuit 143 outputs an erase voltage setting signal Vera_set for setting an erase voltage to be lower than the initial erase voltage.

The control logic 140 controls the voltage generating circuit 150 and the address decoder 120 to perform the erase voltage application operation (S340). The erase voltage application operation S340 is similar to the erase voltage application operation S120 and the erase voltage application operation S210 of FIG. 5, thus a detailed description thereof will be omitted.

Then, the control logic 140 controls the peripheral circuit 170 to perform the erase verification operation (S350). During the erase verification operation, the voltage generating circuit 150 generates and outputs an erase verification voltage Vverify, and the address decoder 120 applies the erase verification voltage Vverify to the word lines WLs of the selected memory block BLK1. The read and write circuit 130 senses a potential level or a quantity of current of the bit lines BL1 to BLm and generates a sensing voltage VPB.

The pass/fail check circuit 160 compares the sensing voltage VPB with a reference voltage, determines whether the erase operation passes or fails, and generates and outputs a pass signal PASS or a fail signal FAIL (S360). When all of the memory cells or a predetermined number or more memory cells of the selected memory block BLK1 are erased to have a threshold voltage lower than a normal erase verification level (for example, HEV_1), the pass/fail check circuit 160 determines that the erase operation passes and outputs a pass signal PASS, and when one or more memory cells or a predetermined number or more memory cells of the selected memory block BLK1 have a threshold voltage higher than the normal erase verification level (for example, HEV_1), the pass/fail check circuit 160 determines that the erase operation fails and outputs a fail signal FAIL.

When the fail signal FAIL is output from the pass/fail check circuit 160, the control logic 140 sets the erase voltage Vera by increasing the erase voltage Vera by a step voltage (S370), and controls the peripheral circuit 170 to re-perform the operations from operation S340 by using the set erase voltage Vera.

As described above, according to an embodiment of the present disclosure, it is possible to improve reliability of the erase operation of the semiconductor memory device by checking an erase characteristic of each memory block, storing characteristic information in a EC cell of each memory block as EC data, reading the EC data during the erase operation, and setting an erase voltage.

Further, in an embodiment of the present disclosure, the erase voltage is reset during the erase operation of each memory block by checking the erase characteristic of each of the plurality of memory blocks, but an erase voltage may be set by using an average erase characteristic by checking the erase characteristic for the plurality of memory blocks included in the semiconductor memory device 100 and averaging the checked erase characteristics, so that the erase voltage may be commonly used during the erase operation of the plurality of memory blocks.

Figure 8:
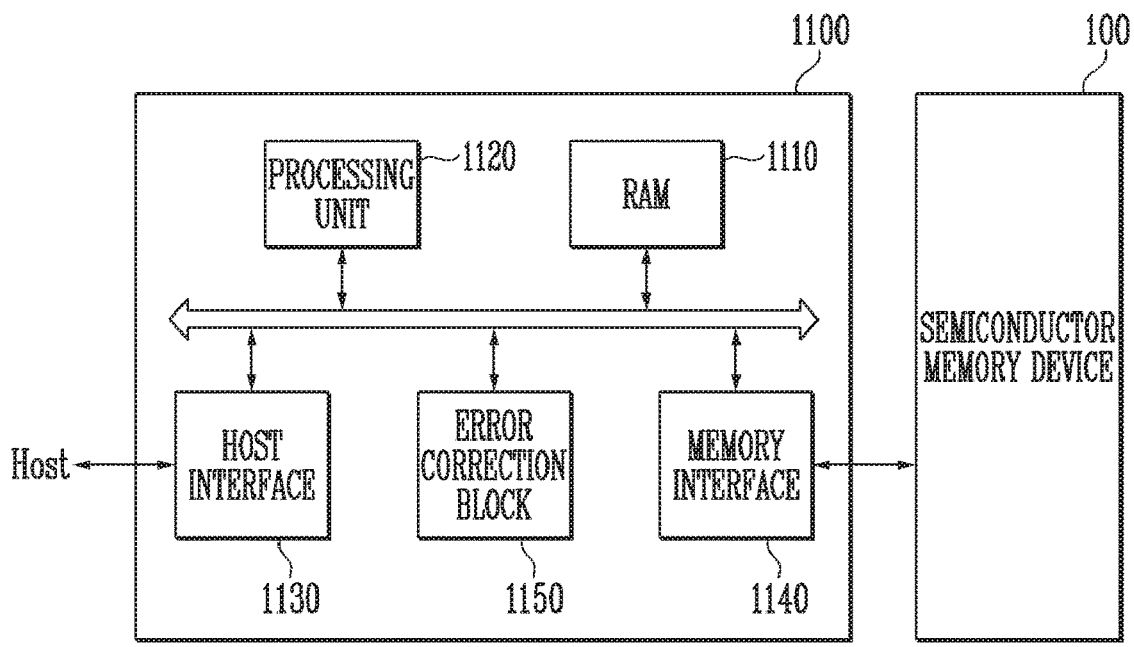
FIG. 8 is a block diagram illustrating a memory system including the semiconductor memory device of FIG. 1.

Referring to FIG. 8, a memory system 1000 includes a semiconductor memory device 100 and a controller 1100.

The semiconductor memory device 100 may be configured and operated in a similar manner to that described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a Random Access Memory (RAM) 1110, a processing unit 1120, a host interface 1130, a memory interface 1140, and an error correction block 1150. The RAM 1110 is used as at least one among a working memory of the processing unit 1120, a cache memory between the semiconductor memory device 100 and the host Host, and a buffer memory between the semiconductor memory device 100 and the host Host. The processing unit 1120 controls a general operation of the controller 1100. Further, the controller 1100 may temporarily store program data provided from the host Host during the write operation.

The host interface 1130 includes a protocol for performing a data exchange between the host Host and the controller 1100. As an example embodiment, the controller 1100 is configured to communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 interfaces with the semiconductor memory device 100. For example, the memory interface includes a NAND interface or a NOR interface.

The error correction block 1150 is configured to detect and correct an error in data received from the semiconductor memory device 100 by using an Error Correction Code (ECC). The processing unit 1120 may control the semiconductor memory device 100 to adjust a read voltage according to a result of the error detection of the error correction block 1150 and perform a re-read operation. As an example embodiment, the error correction block may be provided as a constituent element of the controller 1100.

The controller 1100 and the semiconductor memory device 100 may be integrated into one semiconductor device. As an example embodiment, the controller 1100 and the semiconductor memory device 100 may be integrated into one semiconductor device to configure a memory card. For example, the controller 1100 and the semiconductor memory device 100 may be integrated into one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into one semiconductor device to configure a semiconductor drive (Solid State Drive (SSD)). The semiconductor drive (SSD) includes a storage device configured to store data in a semiconductor memory. If the memory system 1000 is used as an SSD, a speed of the operation of the host Host connected to the memory system 1000 may be remarkably improved.

For another example, the memory system 1000 is provided as one of various constituent elements of an electronic device, such as a computer, an ultra mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements devices configuring a computing system.

In an embodiment, the semiconductor memory device 100 or the memory system 1000 may be embedded in various types of packages. For example, the semiconductor memory device 100 or the memory system 1000 may be packaged and embedded by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 9:
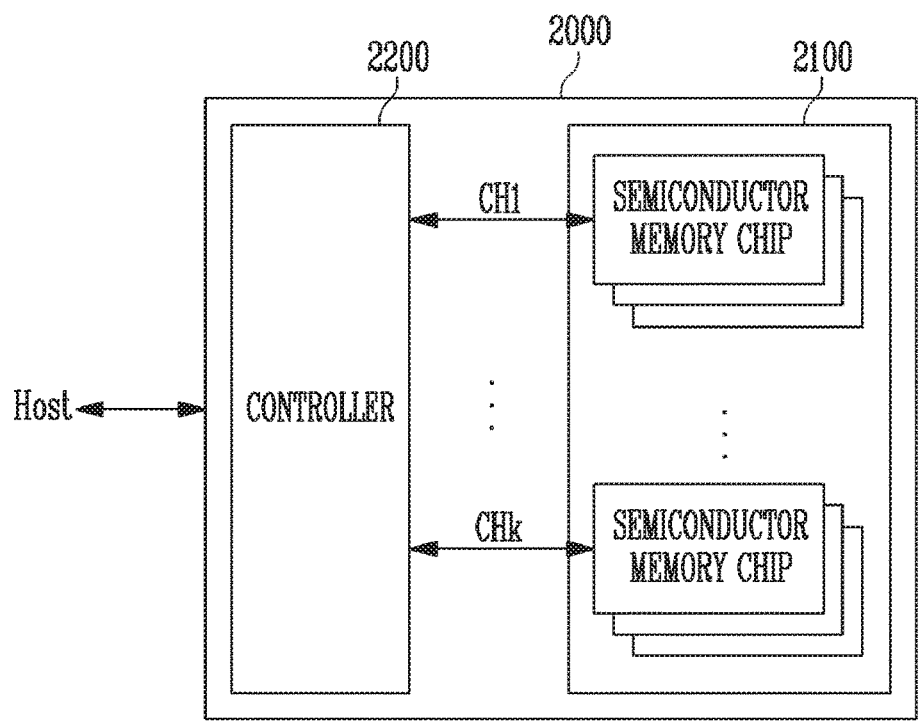
FIG. 9 is a block diagram illustrating an application example of the memory system of FIG. 8.

FIG. 9 is a block diagram illustrating an application example of the memory system of FIG. 8.

Referring to FIG. 9, a memory system 2000 includes a semiconductor memory device 2100 and a controller 2200. The semiconductor memory device 2100 includes a plurality of semiconductor memory chips. The plurality of semiconductor memory chips is divided into a plurality of groups.

In FIG. 9, it is illustrated that the plurality of groups communicates with the controller 2200 through first to kth channels CH1 to CHk, respectively. Each semiconductor memory chip may be configured and operated in a similar manner to that of one in the semiconductor memory device 100 described with reference to FIG. 1. That is, an erase voltage may be set for each of the semiconductor memory chips by checking an erase characteristic of each of the plurality of semiconductor memory chips.

Each group is configured to communicate with the controller 2200 through one common channel. The controller 2200 is configured in a similar manner to that of the controller 1100 described with reference to FIG. 8, and is configured to control the plurality of memory chips of the semiconductor memory device 2100 through the plurality of channels CH1 to CHk.

Figure 10:
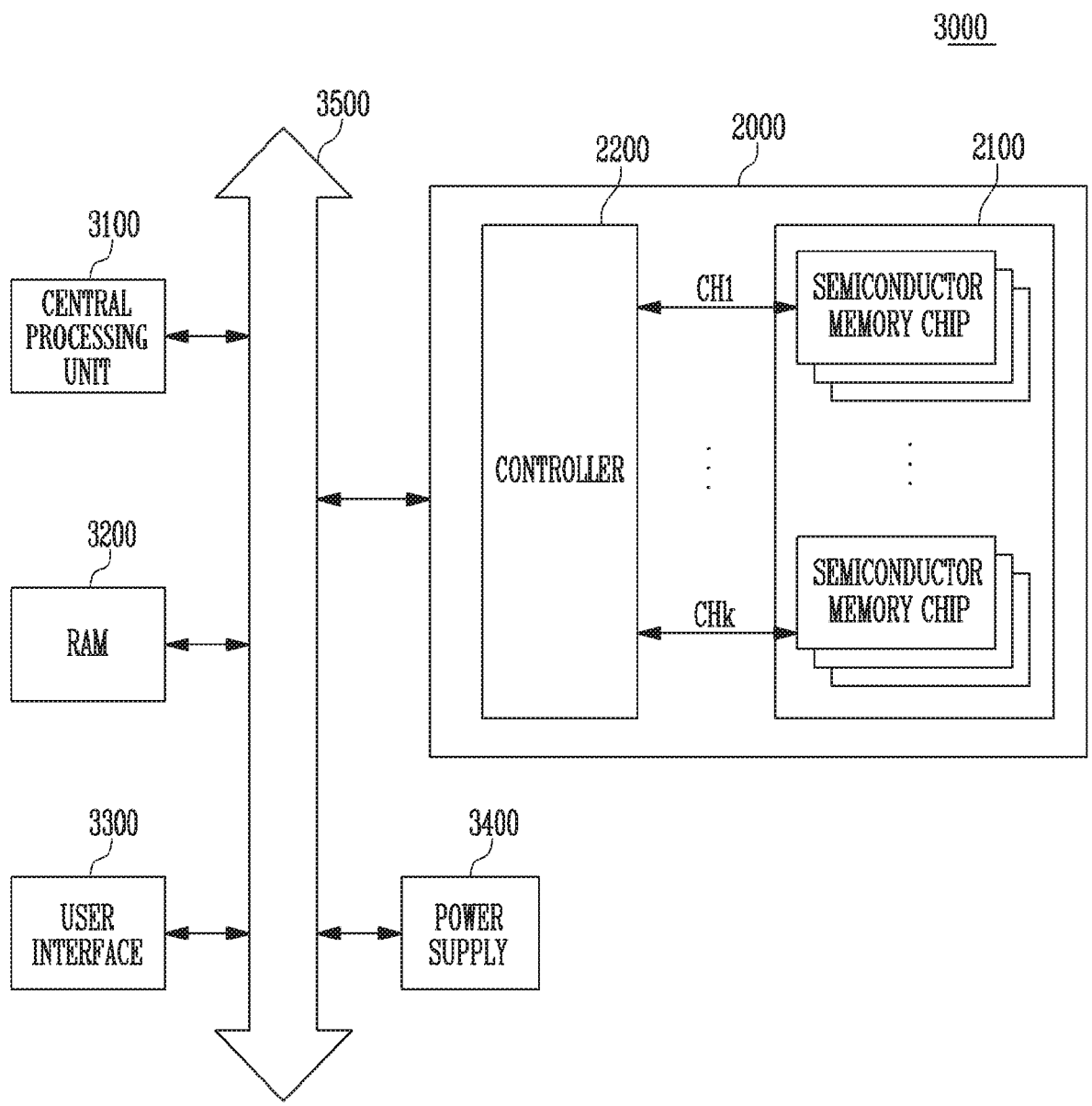
FIG. 10 is a block diagram illustrating a computing system including the memory system described with reference to FIG. 9.

FIG. 10 is a block diagram illustrating a computing system including the memory system described with reference to FIG. 9.

Referring to FIG. 10, a computing system 3000 includes a central processing unit 3100, a Random Access Memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 10, it is illustrated that the semiconductor memory device 2100 is connected to the system bus 3500 through the controller 2200. However, the semiconductor memory device 2100 may be configured to be directly connected to the system bus 3500. In this case, a function of the controller 2200 may be performed by the central processing unit 3100 and the RAM 3200.

In FIG. 10, it is illustrated that the memory system 2000 described with reference to FIG. 9 is provided. However, the memory system 2000 may be substituted with the memory system 1000 described with reference to FIG. 8. As an exemplary embodiment, the computing system 3000 may be configured to include all of the memory systems 1000 and 2000 described with reference to FIGS. 8 and 9.

The detailed description of the present disclosure includes the description of the particular example embodiments, but various modifications are available within the scope without departing from the scope and the technical spirit of the present disclosure. Therefore, the scope of the present disclosure is not limited to the example embodiments described, but shall be defined by the claims to be described below and the equivalents to the claims.

What is claimed is:
1. A semiconductor memory device, comprising:
   a memory cell array including a plurality of memory blocks;
   a peripheral circuit configured to perform an erase characteristic check operation and an erase operation on the plurality of memory blocks; and
   a control circuit configured to control the peripheral circuit to:
      perform the erase characteristic check operation and the erase operation;
      determine whether each of the plurality of memory blocks has a normal erase characteristic or an overerase characteristic according to a result of the erase characteristic check operation for each of the plurality of memory blocks; and
      set an erase voltage of the erase operation based on the determined erase characteristic according to the result of the erase characteristic check operation.

2. The semiconductor memory device of claim 1, wherein the control circuit includes:
   a ROM configured to store an algorithm, and output an internal control signal according to the algorithm in response to a command corresponding to the erase characteristic check operation or the erase operation;
   a control signal generating circuit configured to output a plurality of control signals for controlling the peripheral circuit in response to the internal control signal;
   an erase voltage setting circuit configured to output an erase voltage setting signal in response to data corresponding to an erase characteristic;

a memory block characteristic determining circuit configured to determine whether the plurality of memory blocks has the normal erase characteristic or the overerase characteristic in response to a pass or fail signal output from the peripheral circuit and output block data; and a register configured to store the block data and output the stored block data as the data corresponding to the erase characteristic.

3. The semiconductor memory device of claim 2, wherein the control signal generating circuit outputs a control signal for controlling the peripheral circuit to adjust a potential level of the erase voltage used in the erase operation in response to the erase voltage setting signal.

4. The semiconductor memory device of claim 1, wherein the control circuit controls the peripheral circuit to sequentially perform the erase characteristic check operation on the plurality of memory blocks.

5. The semiconductor memory device of claim 1, wherein the control circuit controls the peripheral circuit to perform an erase voltage application operation on a selected memory block among the plurality of memory blocks during the erase characteristic check operation, and then sets an initial erase voltage by performing a first erase verification operation.

6. The semiconductor memory device of claim 5, wherein when it is determined that a result of the first erase verification operation is pass, the control circuit sets a finally applied erase voltage as the initial erase voltage.

7. The semiconductor memory device of claim 5, wherein the control circuit controls the peripheral circuit to perform an erase voltage application operation on the selected memory block by using the initial erase voltage after setting the initial erase voltage, and then sequentially perform the first erase verification operation and a second erase verification operation.

8. The semiconductor memory device of claim 7, wherein the control circuit controls the peripheral circuit to output the pass or fail signal by determining whether the memory cells of the selected memory block are erased to have lower threshold voltages than a first erase verification level during the first erase verification operation, and output the pass or fail signal by determining whether the memory cells of the selected memory block are erased to have lower threshold voltages than a second erase verification level that is lower than the first erase verification level during the second erase verification operation.

9. The semiconductor memory device of claim 8, wherein the control circuit determines whether the selected memory block has the normal erase characteristic or the overerase characteristic according to the pass or fail signal during the first erase verification operation and the pass or fail signal during the second erase verification operation, and generates data corresponding to an erase characteristic according to a result of the determination.

10. The semiconductor memory device of claim 9, wherein when the pass signal is generated in both the first erase verification operation and the second erase verification operation, the control circuit determines that the selected memory block has the overerase characteristic, and when the pass signal is generated in the first erase verification operation and the fail signal is generated in the second erase verification operation, the control circuit determines that the selected memory block has the normal erase characteristic.

11. The semiconductor memory device of claim 9, wherein the control circuit controls the peripheral circuit to perform a program operation of programming the data in a plurality of erase characteristic (EC) cells of the selected memory block.

12. The semiconductor memory device of claim 9, wherein the control circuit reads the data stored in the selected memory block and sets the erase voltage during the erase operation.

13. The semiconductor memory device of claim 12, wherein the control circuit determines whether the selected memory block has the normal erase characteristic or the overerase characteristic according to the read data, and when the selected memory block has the normal erase characteristic, the control circuit sets the erase voltage with an initial erase voltage, and when the selected memory block has the overerase characteristic, the control circuit sets the erase voltage with a voltage having a lower potential level than that of the initial erase voltage.

14. A semiconductor memory device, comprising:

a memory cell array including a plurality of memory blocks;

a peripheral circuit configured to sequentially perform an erase voltage application operation, a first erase verification operation, and a second erase verification operation on the plurality of memory blocks; and a control circuit configured to:

control the peripheral circuit to perform the erase voltage application operation, the first erase verification operation, and the second erase verification operation;

generate data corresponding to an erase characteristic of each of the plurality of memory blocks according to results of the first erase verification operation and the second erase verification operation; and set an erase voltage of an erase operation for a selected memory block of the plurality of memory blocks based on the data corresponding to the erase characteristic of the selected memory block.

15. The semiconductor memory device of claim 14, wherein each of the plurality of memory block includes a plurality of erase characteristic (EC) cells.

16. The semiconductor memory device of claim 15, wherein the control circuit controls the peripheral circuit to store the data in the plurality of EC cells of each of the plurality of memory blocks.

17. The semiconductor memory device of claim 14, wherein the peripheral circuit applies an initial erase voltage to a common source line of the selected memory block among the plurality of memory blocks during the erase voltage application operation.

18. The semiconductor memory device of claim 14, wherein the peripheral circuit outputs the pass or fail signal by determining whether the memory cells of the selected memory block are erased to have threshold voltages lower than a first erase verification level during the first erase verification operation, and the peripheral circuit outputs the pass or fail signal by determining whether the memory cells of the selected memory block are erased to have threshold voltages lower than a second erase verification level that is lower than the first erase verification level during the second erase verification operation.

19. The semiconductor memory device of claim 18, wherein the control circuit determines whether the selected memory block has a normal erase characteristic or an overerase characteristic according to the pass or fail signal during the first erase verification operation and the pass or fail signal during the second erase verification operation, and generates the data according to a result of the determination.

20. The semiconductor memory device of claim 14, wherein the control circuit controls the peripheral circuit to set an erase voltage by using the data corresponding to the selected memory block among the plurality of memory blocks during an erase operation, and perform the erase operation on the selected memory block by using the set erase voltage.

21. The semiconductor memory device of claim 14, wherein the control circuit includes:
   a ROM configured to store an algorithm and output an internal control signal according to the algorithm in response to a command input from the outside;
   a control signal generating circuit configured to output a plurality of control signals for controlling the peripheral circuit in response to the internal control signal;
   an erase voltage setting circuit configured to output an erase voltage setting signal in response to the data;
   a memory block characteristic determining circuit configured to determine whether the plurality of memory blocks has a normal erase characteristic or an overerase characteristic in response to a pass or fail signal output from the peripheral circuit and outputs block data; and
   a register configured to store the block data and output the block data as the data.

22. A method of operating a semiconductor memory device, comprising:
   applying an initial erase voltage to a selected memory block among a plurality of memory blocks;
   performing a first erase verification operation using a first erase verification level;
   performing a second erase verification operation using a second erase verification level that is lower than the first erase verification level when it is determined that a result of the first erase verification operation is pass;
   determining that the selected memory block has an overerase characteristic and generating data corresponding to a result of the determination when it is determined that a result of the second erase verification operation is pass;
   determining that the selected memory block has a normal erase characteristic and generating the data corresponding to a result of the determination when it is determined that the result of the second erase verification operation is fail; and
   setting an erase voltage for an erase operation of the selected memory block based on whether the selected memory block has the normal erase characteristic or the overerase characteristic.

23. The method of claim 22, further comprising:
   programming the data in erase characteristic (EC) cells of the selected memory block.

24. The method of claim 23, further comprising:
   after programming the data, when an erase command for the erase operation of the selected memory block is input, reading the data stored in the EC cells of the selected memory block;
   setting the erase voltage based on the read data; and
   performing the erase operation of the selected memory block by using the set erase voltage.

25. The method of claim 22, further comprising:
   after generating the data corresponding to the selected memory block, re-performing the method from the initial erase voltage application operation on a next memory block among the plurality of memory blocks.

26. The method of claim 22, wherein in the first erase verification operation, when a threshold voltage distribution of the memory cells included in the selected memory block is lower than the first erase verification level, the erase operation is determined to be pass.

27. The method of claim 22, wherein in the second erase verification operation, when a threshold voltage distribution of the memory cells included in the selected memory block is lower than the second erase verification level, the erase operation is determined to be pass.

* * * * *